United States Patent
Magnee et al.

(10) Patent No.: US 6,917,077 B2
(45) Date of Patent: Jul. 12, 2005

(54) PROTECTION DIODE FOR IMPROVED RUGGEDNESS OF A RADIO FREQUENCY POWER TRANSISTOR AND SELF-DEFINING METHOD TO MANUFACTURE SUCH PROTECTION DIODE

(75) Inventors: Petrus Hubertus Cornelis Magnee, Eindhoven (NL); Freerk Van Rijs, Nijmegen (NL); Hendrik Gezienus Albert Huizing, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/972,576

(22) Filed: Oct. 5, 2001

(65) Prior Publication Data

US 2002/0040996 A1 Apr. 11, 2002

(30) Foreign Application Priority Data

Oct. 8, 2000 (EP) ............................................ 00203491

(51) Int. Cl.$^7$ ........................................... H01L 31/119
(52) U.S. Cl. ........................ 257/341; 257/342; 257/327; 257/168; 257/199; 257/367; 257/583; 257/345; 257/349; 257/355; 257/373; 257/376; 438/282; 438/298; 438/910; 438/140
(58) Field of Search ................................ 257/349, 355, 257/373, 376, 341, 342, 327, 168, 199, 367, 583, 345; 438/298, 910, 140, 282

(56) References Cited

U.S. PATENT DOCUMENTS

| 4,344,081 A | * | 8/1982 | Pao et al. ..................... 257/378 |
| 4,979,001 A | | 12/1990 | Alter ............................ 357/13 |
| 5,300,451 A | * | 4/1994 | Zambrano ..................... 438/59 |
| 5,410,177 A | * | 4/1995 | Harmel et al. ............... 257/567 |
| 5,751,052 A | | 5/1998 | Heminger et al. ........... 257/577 |

FOREIGN PATENT DOCUMENTS

| EP | 0387836 A2 | 3/1990 | ............ H01L/27/06 |
| WO | WO9717726 | 11/1995 | ......... H01L/21/331 |

* cited by examiner

Primary Examiner—Eddie Lee
Assistant Examiner—Junghwa Im
(74) Attorney, Agent, or Firm—Peter Zawilski

(57) ABSTRACT

A semiconductor arrangement including:
  a substrate having a substrate layer (13) with an upper and lower surface, the substrate layer (13) being of a first conductivity type;
  a first buried layer (12) in the substrate, extending along said lower surface below a first portion of said upper surface of said substrate layer (13), and a second buried layer (12) in the substrate, extending along said lower surface below a second portion of said upper surface of said substrate layer (13);
  a first diffusion (26) in said first portion of said substrate layer (13), being of a second conductivity type opposite to said first conductivity type and having a first distance to said first buried layer (12) for defining a first breakdown voltage between said first diffusion (26) and said first buried layer (12);
  a second diffusion (45) in said second portion of said substrate layer (13), being of said second conductivity type and having a second distance to said second buried layer (12) for defining a second breakdown voltage between said second diffusion (45) and said second buried layer (12);
said first distance being larger than said second distance such that said first breakdown voltage is larger than said second breakdown voltage.

14 Claims, 5 Drawing Sheets

PROTECTION DIODE FOR IMPROVED RUGGEDNESS OF A RADIO FREQUENCY POWER TRANSISTOR AND SELF-DEFINING METHOD TO MANUFACTURE SUCH PROTECTION DIODE

FIELD OF THE INVENTION

The present invention relates to a semiconductor arrangement with a protection diode for improved ruggedness of a radio frequency power transistor and self-defining method to manufacture such protection diode as defined in the outset of claim 1.

BACKGROUND OF THE INVENTION

Radio frequency (RF) power transistors are used e.g. for mobile communication devices in the frequency range from 900 MHz to 2 GHz. Failure of RF power transistors can occur due to a mismatch of the load impedance (e.g. an antenna) and the output impedance of the transistor. Due to the impedance mismatch the voltage between base and collector of the RF transistor may increase above the level where breakdown occurs and the transistor becomes damaged. A protection diode connected between collector and emitter will prevent breakdown of the transistor by providing a lower breakdown voltage for the diode. Such a device is known from U.S. Pat. No. 5,751,052, which shows a transistor integrated with a Zener diode as protection diode. In FIG. 2 of U.S. Pat. No. 5,751,052 a cross-sectional view of a device comprising a transistor and a protection Zener diode is shown. During the manufacturing of a device according to this prior art, the construction of the Zener diode requires additional processing steps. As known to persons skilled in the art of semiconductor technology, such steps comprise the formation of precisely defined lateral diffusion zones for which the respective depth must also be defined precisely.

Therefore, the formation of a Zener diode disadvantageously contributes to the manufacturing time and costs of the device. Moreover, the formation of a Zener diode may be prohibited in some types of power transistor device due to restrictions imposed by the technology. For example, in a double poly-Si process for bipolar devices as known in the art, formation of a Zener diode connected to a RF power transistor is not feasible.

SUMMARY OF THE INVENTION

It is an object of the present invention to provide a bipolar device comprising a RF power transistor and a protection diode and a method to manufacture such a bipolar device in a double poly-Si process.

The present invention relates to a semiconductor arrangement comprising: a substrate having a substrate layer with an upper surface and a lower surface, the substrate layer being of a first conductivity type; a first buried layer in the substrate, extending along said lower surface below a first portion of said upper surface of said substrate layer, and a second buried layer in the substrate, extending along said lower surface below a second portion of said upper surface of said substrate layer; a first diffusion region in said first portion of said substrate layer, being of a second conductivity type opposite to said first conductivity type and having a first distance to said first buried layer for defining a first breakdown voltage between said first diffusion region and said first buried layer; a second diffusion region in said second portion of said substrate layer, being of said second conductivity type and having a second distance to said second buried layer for defining a second breakdown voltage between said second diffusion region and said second buried layer; said first distance being larger than said second distance such that said first breakdown voltage is larger than said second breakdown voltage.

Moreover, the present invention relates to the arrangement as described above, wherein said first diffusion region is a base of a bipolar transistor and said first buried layer is a collector of said bipolar transistor.

Also, the present invention relates to the aforementioned arrangement, wherein said second diffusion region is an anode of a protection diode and said second buried layer is a cathode of said protection diode.

Furthermore, the present invention relates to the aforementioned arrangement, wherein said first buried layer is connected to said second buried layer, and said first and second buried layers are manufactured in the same step.

Also, the present invention relates to the arrangement as defined above, further comprising a channel stopper region in said second portion of said substrate layer; the channel stopper region being of said first conductivity type, for electrically isolating said second portion of said substrate layer within the substrate, wherein said channel stopper region is arranged to extend substantially as an extended channel stopper region in between said second diffusion region and said second buried layer, for reducing said second breakdown voltage.

The present invention relates to a method of manufacturing a semiconductor arrangement, comprising the steps of:
providing a substrate with a substrate layer with an upper surface and a lower surface, the substrate layer being of a first conductivity type, a first buried layer being provided in the substrate, extending along said lower surface below a first portion of said upper surface of said substrate layer, and a second buried layer being provided in the substrate, extending along said lower surface below a second portion of said upper surface of said substrate layer;
diffusing a first diffusion region in said first portion of said substrate layer, being of a second conductivity type opposite to said first conductivity type and having a first distance to said first buried layer for defining a first breakdown voltage between said first diffusion region and said first buried layer;
diffusing a second diffusion region in said second portion of said substrate layer, being of said second conductivity type and having a second distance to said second buried layer for defining a second breakdown voltage between said second diffusion region and said second buried layer;
said first distance being larger than said second distance such that first breakdown voltage is larger than said second breakdown voltage.

Moreover, the present invention relates to the method described above, wherein said first and second diffusion regions are formed by depositing, in a single manufacturing step, a first poly-silicon layer in a first area in said first portion and a second poly-silicon layer in a second area in said second portion, and diffusing said first and second diffusion regions from said first and second poly-silicon layers, respectively, in a single annealing step, said first area being smaller than said second area.

Furthermore, the present invention relates to the aforementioned method, further comprising the step of forming by ion-implantation a channel stopper region in said second portion of said substrate layer; the channel stopper regions being of said first conductivity type, for electrically isolating said second portion of said substrate layer within the substrate, wherein said channel stopper region is formed by ion-implantation as an extended channel stopper region in between said second diffusion region and said second buried layer, for reducing said second breakdown voltage.

According to the present invention the formation of the protection diode does not require any additional processing steps (e.g., deposition, implantation, masking and etching) in comparison with the processing steps required to construct a separate RF power transistor. The protection diode is formed within the same processing steps as the power transistor. Moreover, the method of the present invention is self-defining: i.e., any variations occurring during the processing steps will influence the electrical (and physical) properties of both power transistor and protection diode in a similar way. Under these circumstances the breakdown voltage of the protection diode will always be lower than the detrimental breakdown voltage of the transistor.

SUMMARY OF THE INVENTION

Below, the invention will be explained with reference to some drawings, which are intended for illustration purposes only and not to limit the scope of protection as defined in the accompanying claims.

DETAILED DESCRIPTION OF THE INVENTION

Figure 1:
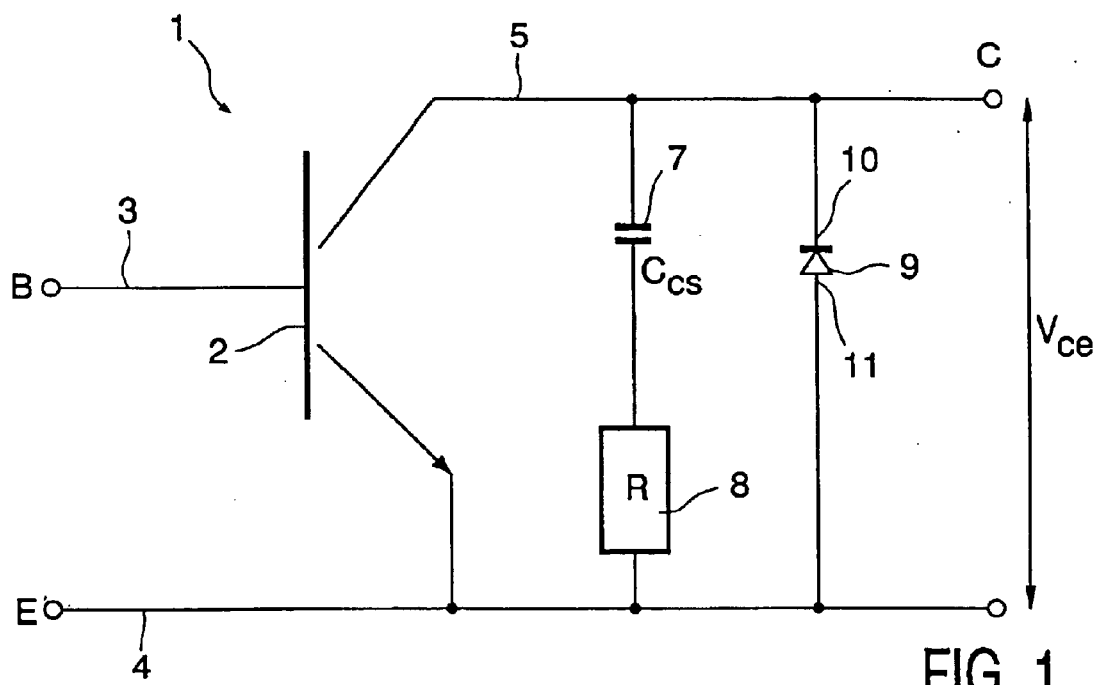
FIG. 1 shows a schematic, prior art illustration of a circuit comprising a RF power transistor and protection diode.

FIG. 1 shows a schematic illustration of a prior art circuit comprising a RF power transistor and protection diode. In the circuit 1 of FIG. 1, the RF power transistor 2 is shown comprising a base 3, an emitter 4 and a collector 5. The RF power transistor 2 is in a configuration, known in the art as a common emitter configuration, where emitter 4 and the substrate region 6 (not shown) are at electrical ground level. Between emitter 4 and collector 5 there is a parasitic capacitance 7 in series with a resistance 8. Parallel to the parasitic capacitance 7 and resistance 8 a protection diode 9 between collector 5 and emitter 4 is created in the manufacturing process. The protection diode 9 comprises a cathode 10 and an anode 11. The protection diode 9 serves to prevent damage of the RF power transistor 2 in case the voltage between collector 5 and base 3 increases to the breakdown level of the transistor. The protection diode 9 will clip at a lower level voltage $V_{CE}$, before breakdown of the transistor occurs.

The circuit 1 according to the present invention is produced in a standard double poly-silicon process for bipolar transistor devices, without the application of additional processing steps. The protection diode 9 is formed during the same processing steps as required for the power transistor 2.

Figure 2:
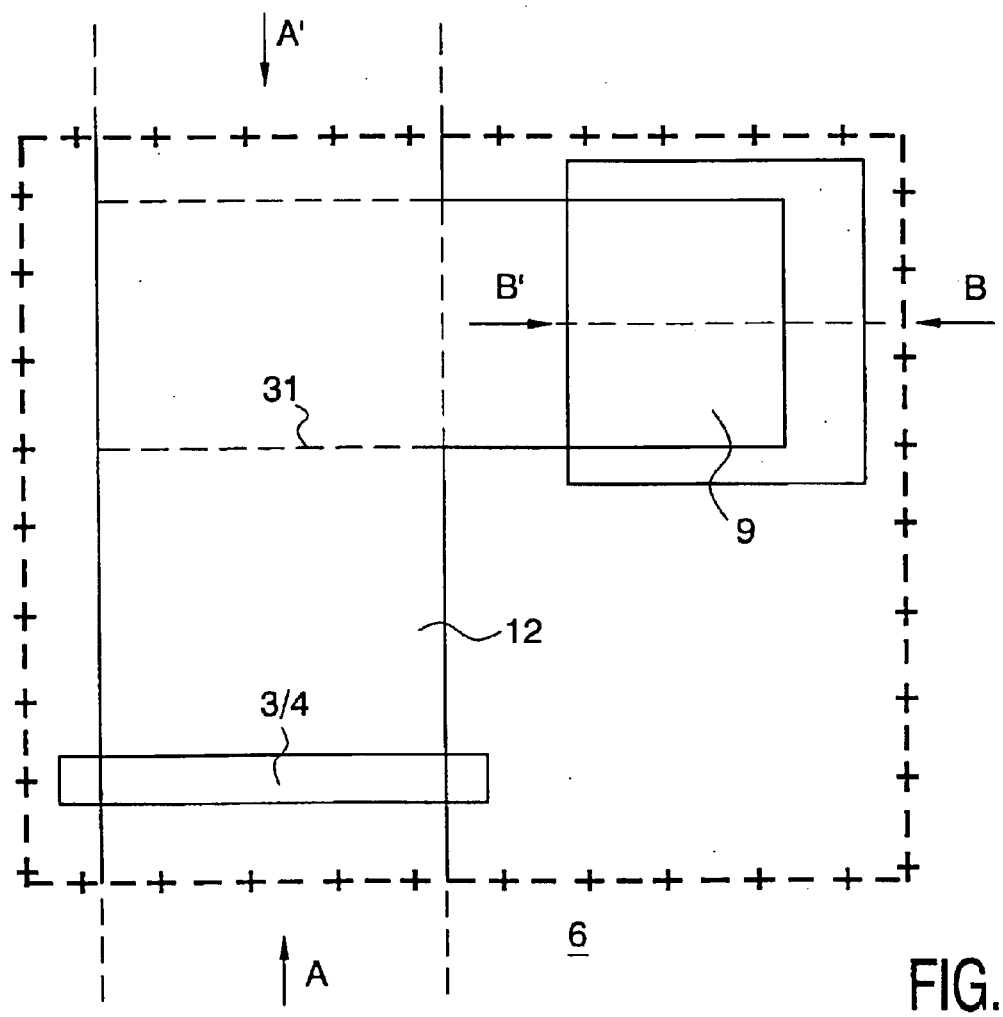
FIG. 2 shows schematically a layout in plane view for a device comprising a RF power transistor and protection diode according to the present invention.

FIG. 2 shows schematically an exemplary layout in plane view for a device comprising a RF power transistor 2 and protection diode 9 according to the present invention. On the n-type epitaxial surface layer 13 of substrate 6 a base region 3, an emitter region 4, a collector region 12 and a protection diode region 9 are defined. In this layout at the surface level of the substrate 6, the base region 3 and emitter region 4 are located closely together in a common area. At some distance at the same surface level the diode region 9 is located. Below the surface level of the substrate 6, a buried collector region 12 is defined, which extends from below the base and emitter regions 3, 4 to below the diode region 9. In the collector region 12 a collector opening region 31 to connect the collector, is provided. Around these regions 3, 4, 5, 9, 31, a channel stopper (depicted by a dashed line) is defined to isolate the device from neighboring devices. Outside of the collector region 12 the channel stopper locally dopes the n-type epitaxial surface layer 13 into p-type. The lines AA' and BB' indicate the locations of the cross-sectional views as shown in FIGS. 3a–3m and FIGS. 4a, 4b respectively. It is noted that the buried collector region 12 may extend under a plurality of base and emitter regions 3, 4, that form, in a parallel connection, a single large power transistor. In that case, the channel stopper demarcates the area comprising this single large power transistor.

The processing steps required to form a circuit 1 according to the present invention are illustrated by the following FIGS. 3a–3m which schematically show a cross-sectional area, defined by the line AA' in FIG. 2 wherein the power transistor 2 is formed in successive steps.

Figure 4A:
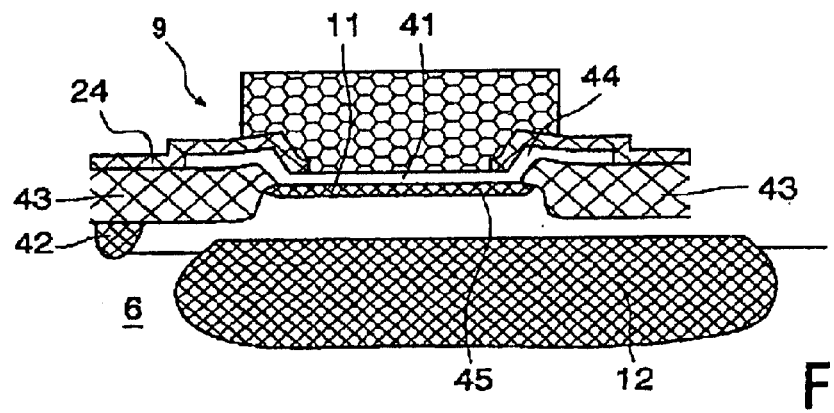
FIGS. 4a and 4b show cross-sectional areas of the protection diode in two respective preferred embodiments after the step of metallization.
Figure 4B:
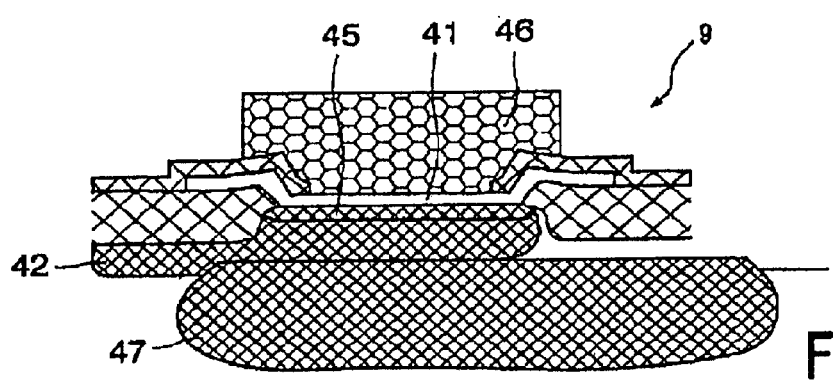

FIGS. 4a and 4b show a cross-sectional area of the protection diode 9, defined by the line BB' in FIG. 2, in two respective preferred embodiments after the step of metallization.

Figure 3A:
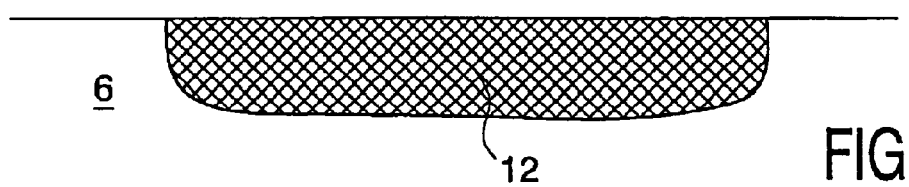
FIGS. 3a–3m show schematically cross-sectional views of the transistor part of the device after successive processing steps according to the present invention.

FIG. 3a shows a step F1 of the formation of a collector region. In substrate 6 a buried collector region 12 is formed. An implantation process defines a laterally confined $n^+$ region 12 in the $p^-$ doped substrate 6 to form the collector 5. As known to persons skilled in the art, the collector region 12 may comprise several areas which are separated during their formation in this step F1 by means of a mask.

Figure 3B:

FIG. 3b illustrates a step F2 of the formation of an n-type epitaxial silicon layer 13 on top of $n^+$ region 12. The dopant of $n^+$ region 12 diffuses slightly into layer 13 due to the thermal exposure during the deposition process of n-type epitaxial silicon layer 13.

Figure 3C:
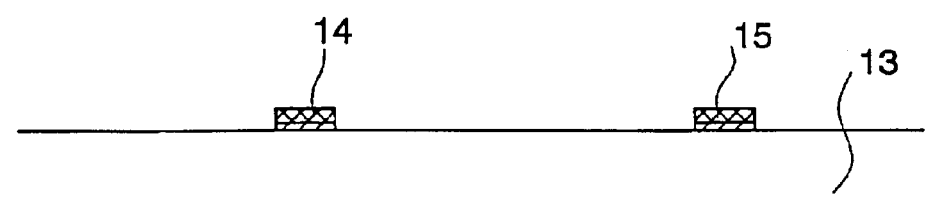

FIG. 3c illustrates a step F3 of lithographic formation of sacrificial masks 14, 15 that define the locations where in a later processing step base and emitter regions 3, 4 and a connection to the $n^+$ region 12 (collector 5) will be formed.

Figure 3D:
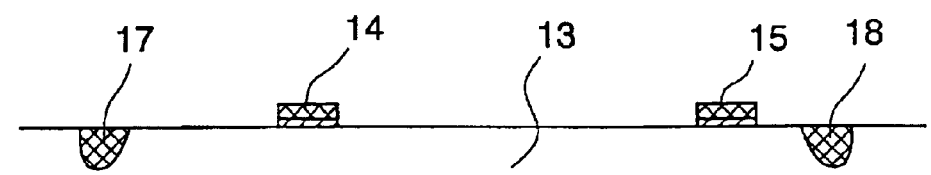

FIG. 3d illustrates a step F4 of the implantation of dopant regions which define channel-stoppers 17, 18 in n-type epitaxial silicon layer 13.

Figure 3E:
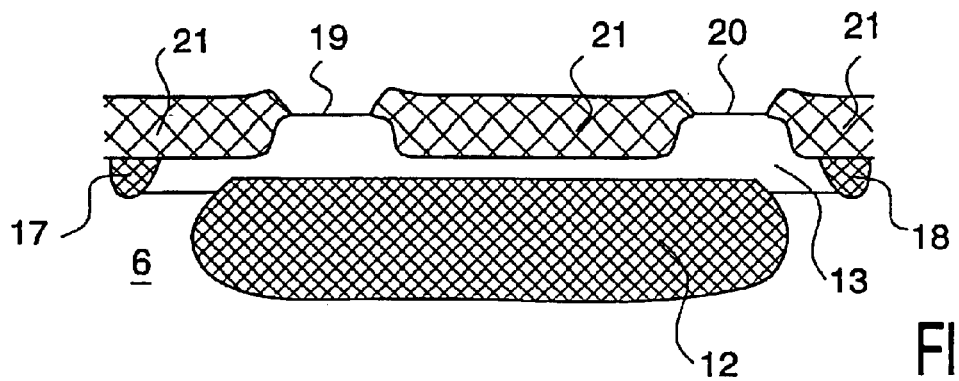

FIG. 3e shows a cross-sectional view after LOCOS oxidation in a step F5. In the n-type epitaxial silicon layer 13 oxidized regions 21 are formed using the sacrificial masks 14 and 15. The oxidized regions 21 isolate the areas 19, 20 to form, in a later processing step, base and emitter regions 3, 4 and a connection to the collector region 5, respectively. Due to thermal exposure during the LOCOS oxidation process, p-type dopant diffuses further into the substrate 6 extending the channel-stoppers 17 and 18 into the substrate 6.

Figure 3F:
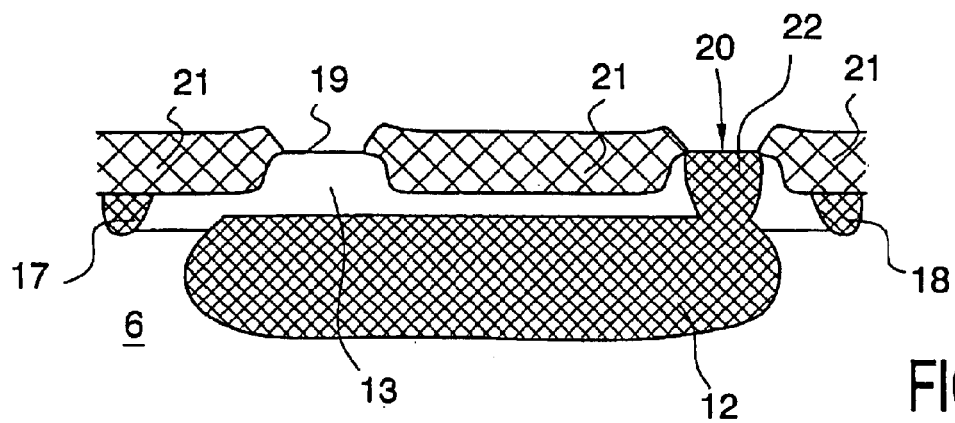

In FIG. 3f a step F6 of the formation of the connection to the collector region 5 ($n^+$ region 12) is illustrated. In the area 20 a deep $n^+$ doped plug 22 is defined by an implantation process. The plug 22 connects the $n^+$ region 12 to the surface of area 20.

Figure 3G:
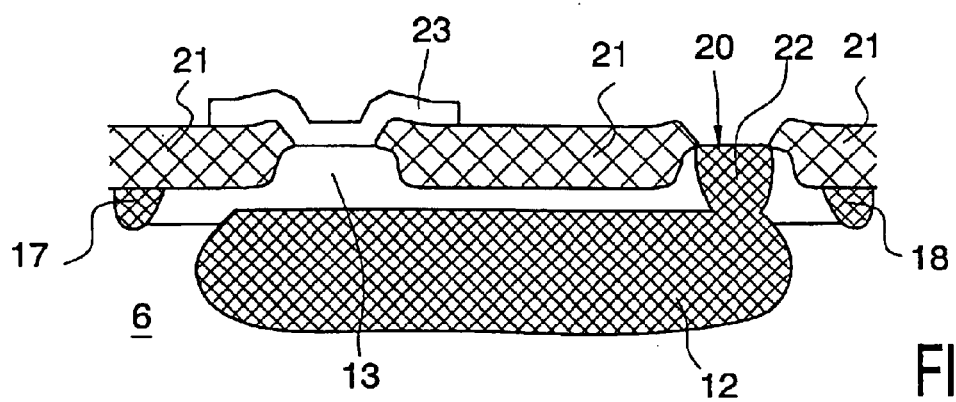

FIG. 3g illustrates a step F7 of the formation of the base and emitter regions 3, 4. A first p$^{++}$ doped poly-silicon layer 23 is deposited, and subsequently patterned on area 19 using lithographic and etching steps as known in the art.

Figure 3H:
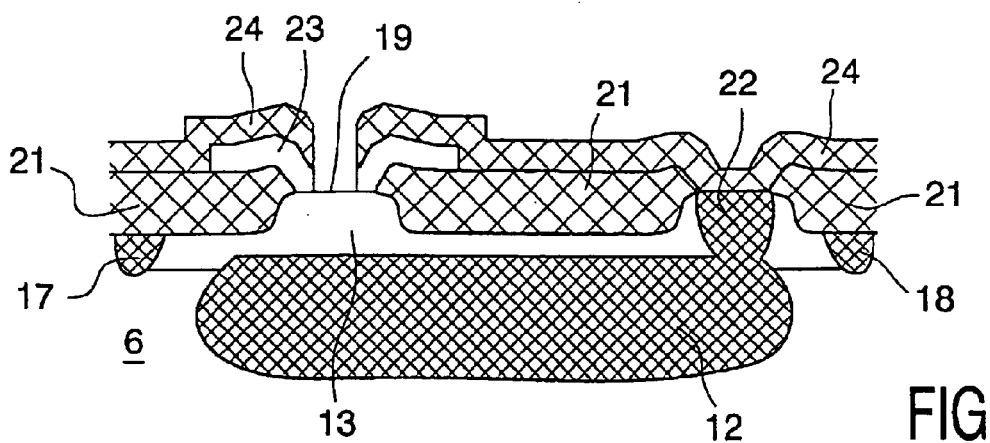

To provide passivation and isolation of the structure, in a next processing step F8 an oxide layer 24 is deposited on top of the structure, as shown in FIG. 3h. By means of a masked etch using processing steps as known in the art, the emitter opening in layer 23 and 24 to area 19 is defined.

Figure 3I:
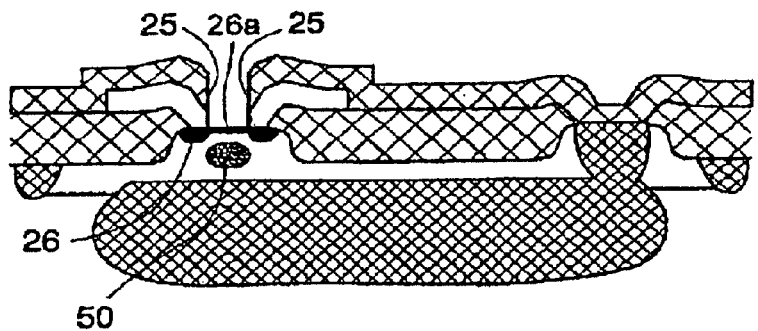

In FIG. 3i a step F9 of the formation of nitride L-spacers 25 on the walls of the emitter opening is illustrated. During the formation of the L-spacers, p-type dopant (e.g. B) from the poly-silicon layer 23 diffuses into the n-type epitaxial silicon layer 13, forming a shallow p$^+$ doped region 26. By local implantation an implanted shallow p$^+$ doped region 26a is formed. Typically, the overall shallow p$^+$ doped region, comprising both region 26 and region 26a, has a length of 1–10 $\mu$m, a width of 0.3 $\mu$m and a depth of 0.2–0.25 $\mu$m. Also, by a local implantation step, a high doped n$^+$ region 50 is formed in the n-type epitaxial silicon layer 13 to provide a lower collector series resistance.

Figure 3J:
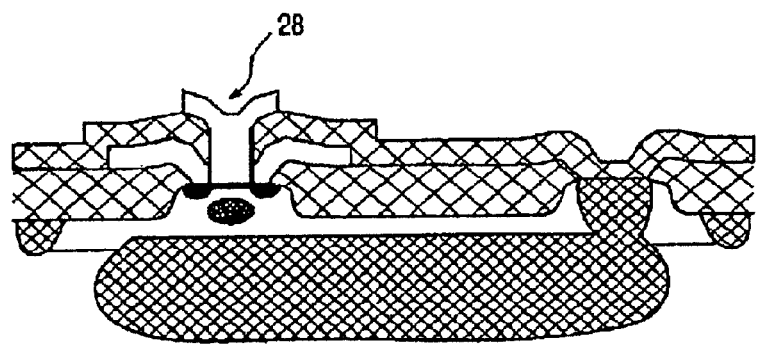

FIG. 3j shows a step F10 of forming a poly-silicon layer and plug using processing steps as known in the art. A second poly-silicon layer 28 is deposited and subsequently patterned as the connection to the emitter region 4 of the transistor. By diffusion of n-type dopant (e.g. As) from the poly-silicon layer 28, a very shallow n$^+$ doped region 27 is formed at the top of the implanted shallow p$^+$ doped region 26a.

Figure 3K:
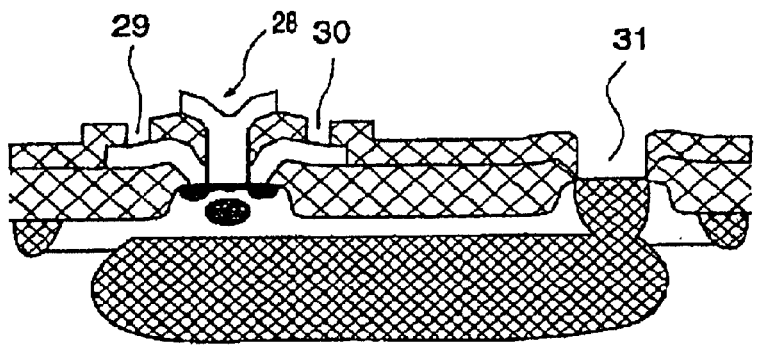

FIG. 3k shows a step F11 of forming the base region contact opening 29, 30 and the collector contact opening 31 by selective etching the oxide layer 24.

Figure 3L:
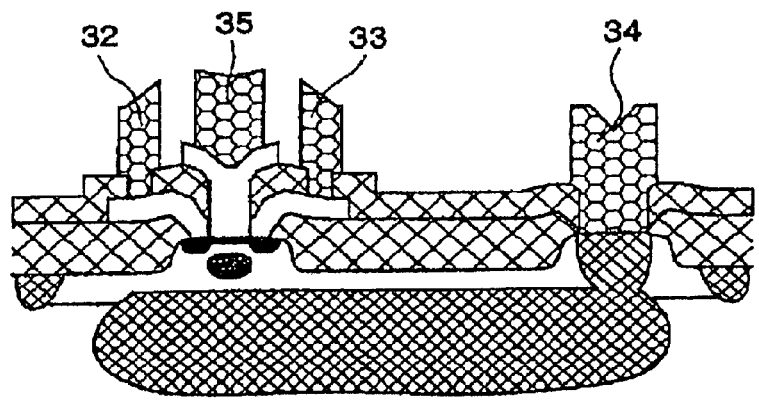

Finally, FIG. 3l shows a step F12 of metallization, in which a metal layer is deposited on the structure. By a patterning step, metal connects 32, 33, 34, 35 are defined for connection to the base region 3 through the contact openings 29, 30, to the collector region 5 through contact opening 31, and to the emitter region 4 through poly-silicon plug 28, respectively.

Figure 3M:
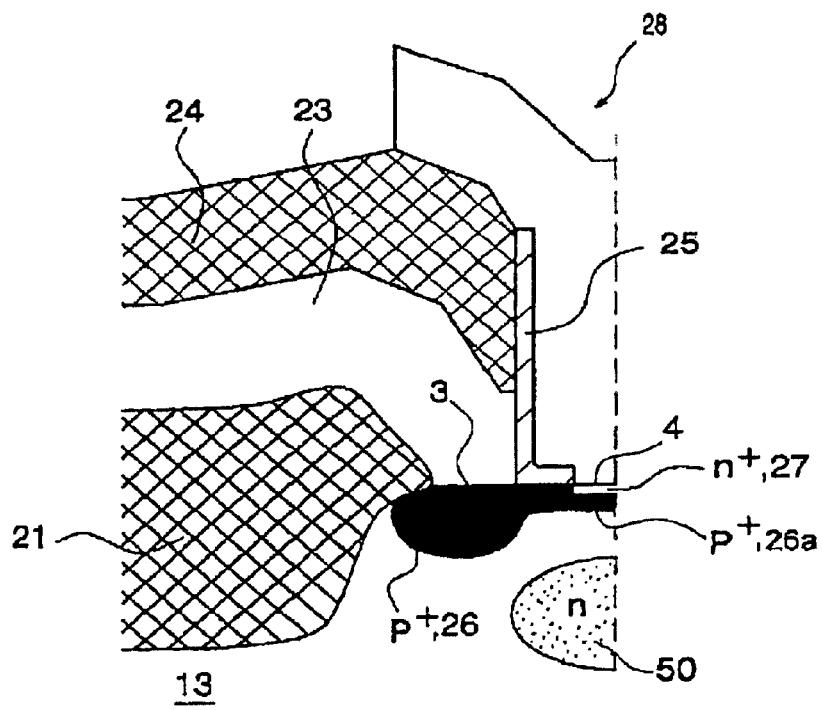

FIG. 3m shows schematically the cross-sectional view of the transistor part of the device to display the dopant regions 13, 26, 26a, 27 and 50, in closer detail. In FIG. 3m, the base region 3, the emitter region 4, the n-type epitaxial silicon layer 13, the oxidized regions 21, the first p$^{++}$ doped poly-silicon layers 23, the oxide layers 24, the nitride L-spacers 25, the shallow p$^+$ doped region 26, the implanted shallow p$^+$ doped region 26a, the very shallow n$^+$ doped region 27 and the highly doped n$^+$ region 50 are shown. Due to the geometry and the size of the contact area between the first p$^{++}$ doped poly-silicon layer 23 and the n-type epitaxial silicon layer 13, a dopant profile for the shallow p$^+$ doped region 26 as schematically shown in FIG. 3m, is created during the diffusion process. Also, due to the diffusion process, the shallow p$^+$ doped region 26, below the base region 3, has a concentration profile of p-type dopant that extends deeper than the concentration profile of p-type dopant in the implanted shallow p$^+$ doped region 26a below the emitter region 3.

Simultaneously with the transistor 2 the protection diode 9 is formed. This is accomplished by a selective use of separate steps in the aforementioned processing steps F1–F12 used to form the transistor.

FIG. 4a shows a protection diode 9 according to the present invention after the step of metallization. It is made in the following way. In step F1, in the substrate 6 the n$^+$ region 12, formed as buried collector region 5 for the transistor, is extended laterally as the cathode region 10 of the protection diode 9. Subsequently, in step F2 the n-type epitaxial silicon layer 13 is deposited. Dopant from the n$^+$ region 12 diffuses slightly into the n-type epitaxial silicon layer 13 due to thermal exposure during epi growth. In step F3, a sacrificial mask is formed to define the area 41 where the anode 11 of the diode will be formed at a later stage. In step F4, a channel stopper 42 is formed. In step F5, oxidized regions 43 are formed using the LOCOS process to isolate the area of the anode 11. Due to annealing during the LOCOS process, the channel stopper 42 now extends into the substrate 6. In step F7, the first p$^{++}$ doped poly-silicon layer 23 is deposited and patterned as a p$^{++}$ doped poly-silicon contact 44 on top of the area of the anode 11. Subsequently, in step F8 the oxide layer 24 for passivation and isolation is deposited over the p$^{++}$ doped poly-silicon contact 44. Due to annealing during step F9, p-type dopant from the p$^{++}$ doped poly-silicon contact 44 diffuses into the n-type epitaxial silicon layer to form a p-type doped region 45. In step F11, the oxide layer 24 is opened to create an anode contact opening. In metallization step F12, the anode contact opening is filled with metal 46.

In this preferred embodiment, the breakdown voltage level of the diode 9 is smaller than the breakdown voltage level between the base and the collector of the transistor, which is determined by the dopant profiles in the shallow p+ doped region 26 and the p-type doped region 45, respectively, and their distances to the buried layer 12.

In the present invention, the area of the anode 11, as depicted by the p-type doped region has typically a length of 1–10 $\mu$m, a width of 10 $\mu$m and a depth of 0.3 $\mu$m. Compared to the length and width of the combined shallow p+ doped regions 26, 26a of the transistor shown in FIG. 3m (length: 1–10 $\mu$m, width: 0.3 $\mu$m, depth: 0.2–0.25 $\mu$m), the areal size of the anode 11 of the diode 9 is much larger than the areal size of base and emitter regions 3, 4 of the transistor.

The difference in areal size influences the dopant profiles, in the shallow p$^+$ doped region 26 and the p-type doped region 45, as formed by the diffusion process. As known to persons skilled in the art, the kinetics of the dopant diffusion process in both the shallow p+ doped region 26 and the p-type doped region 45 will be identical: the thermal exposure of the transistor 2 and diode 9 is identical during the processing steps F1–F12, the source material is identical for the transistor and diode areas: p-type dopant from the first pa doped poly-silicon layer 23 and/or contact 44. The target material is also identical: n-type epitaxial silicon grown in the same process step F2.

However, the dopant profile below the larger p$^{++}$ doped poly-silicon contact area 44 will extend slightly deeper into the n-type epitaxial silicon layer 13 due to a geometric effect: the dimensions of the dopant source as defined by the area 45 are larger. It is estimated that for a depth of the shallow p$^+$ doped region 26 of 0.2–0.25 $\mu$m, the depth of the p-type doped region 45 is 0.30 $\mu$m.

Also, since the kinetics of the dopant diffusion process in both the shallow p+ doped region 26 and the p-type doped region 45 are identical, incidental process variations will influence the dopant profiles in both the shallow p$^+$ doped region 26 and the p-type doped region 45 in a similar way: the method to manufacture a protection diode according to the present invention is self-defining. For example, if due to a higher annealing temperature in step F9, the diffusion depth for the dopant will be deeper for both the shallow p+ doped region 26 and the p-type doped region 45, and all other things being equal, then the dopant profile of the p-type doped region 45 will still be the deeper one. Accordingly, the diode 9 will have a lower breakdown voltage than the base-collector transition of the transistor.

In devices comprising a transistor 2 and diode 9 according to the present invention, the breakdown voltage of the transistor between base and collector is 18–20 V, whereas the diode 9 has a breakdown voltage which is 2 V lower: 16–18 V.

The protection diode 9 comprises a capacitance which is present between the emitter 4 and collector 5, in parallel with the parasitic transistor capacitance 7. In order not to affect the efficiency of the transistor 2 too strongly, the capacitance of the diode 9 must be optimized by means of the areal size of the diode 9. A large capacitance of the diode 9 reduces the transistor efficiency as defined by the power added efficiency (the conversion from dc input power to RF output power). A small capacitance of the diode 9 results in a (too) small current flow through the diode 9, thus reducing the protection capability of the diode 9.

In a second preferred embodiment, the protection diode 9 may exhibit a still lower breakdown voltage. In FIG. 4b the protection diode 9 is shown in this second preferred embodiment. The protection diode 9 according to the second embodiment is formed in the same way as explained above with reference to FIG. 4a. Here, the channel stopper 42 as shown in FIG. 4a, is replaced by a channel stopper 47 which in comparison to channel stopper 42, comprises a larger region extending under the p-type doped region 45 of the diode 9. All other parts of the diode structure shown in FIG. 4b are identical to the ones shown in FIG. 4a. Due to the extension of channel stopper 47 under the p-type doped region 45 of the diode 9, the breakdown voltage level is advantageously reduced to approximately 10 V. However, due to the large size of the channel stopper 47, the capacitance of the protection diode 9 is strongly increased (with an increase in current flow and a reduction of the power added efficiency). By optimizing the channel stopper area 47, the breakdown voltage and the capacitance of the diode 9 can be tuned as required for the application of the device.

It will be appreciated that the method to manufacture a microelectronic device in a self-defining way is not restricted to the particular sequences of processing steps as described above. Other self-defining processing sequences, comprising the same technologies as above or others, may be conceivable. Also, the method is not limited to the described device comprising a power transistor 2 and a protection diode 9, but may be applicable for other types of microelectronic devices as well. For example, the diode 9 may have a different function and may be used detached from the power transistor 2. In general, the method of the present invention may be used in a double poly-Si process for the formation of diodes comprising a junction from poly-silicon to monocrystalline silicon. For example, the method of the present invention may be used to manufacture, in one processing sequence, a plurality of such diodes with slightly different breakdown voltages, in dependence of the areal size of each of the diodes.

Moreover, the principle that the diffusion of dopant into a matrix layer from a covering feed layer is dependent on the geometry of the interface area between that matrix layer and the covering feed layer, can be applied to modify the diffusional transport of a dopant to proceed in one, two or three dimensions by proper definition of the actual size and shape of the interface area: differences in diffusion length in one dimension can be achieved as described above by varying the area size of the interface area. Two dimensional differences in diffusion can be obtained by using narrow lines with various size as the interface area. By using point contacts with various size as the interface area, even three dimensional differences in diffusion may be obtained.

What is claimed is:

1. A semiconductor arrangement comprising:
   a substrate having a substrate layer with an upper surface and a lower surface, the substrate layer being of a first conductivity type;
   a first burled layer in the substrate, extending along said lower surface below a first portion of said upper surface of said substrate layer, and a second burled layer in the substrate, extending along said lower surface below a second portion of said upper surface of said substrate layer;
   a first diffusion region in said first portion of said substrate layer, being of a second conductivity type opposite to said first conductivity type and having a greatest depth at a first point along a width of said first diffusion region and having a lesser depth at a second point along said width;
   a shallow region in said first portion of said substrate layer, being of said first conductivity type and being on top of said second point of said first diffusion region but not on top of said first point of said first diffusion region;
   a second diffusion region in said second portion of said substrate layer, being of said second conductivity type;
   a first polysilicon structure, of the second conductivity type in contact with the first diffusion region;
   a second polysilicon structure, of the first conductivity type, in contact with the shallow region; and
   a dielectric spacer disposed between the first and second polysilicon structures.

2. The arrangement according to claim 1, wherein said first diffusion region a base of a bipolar transistor, said shallow region is an emitter of said bipolar transistor, and said first buried layer is a collector of said bipolar transistor.

3. The arrangement of according to claim 1, wherein said second diffusion region is an anode of a protection diode and said second buried layer is a cathode of said protection diode.

4. The arrangement according to claim 1, wherein said first buried layer is connected to said second burled layer, and said first and second buried layers are manufactured in the same step.

5. The arrangement according to claim 1, further comprising a channel stopper region in said second portion of said substrate layer the channel stopper region being of said first conductivity type, for electrically isolating said second portion of said substrate layer within the substrate, wherein said channel stopper region is arranged to extend substantially as an extended channel stopper region in between said second diffusion region and said second burled layer.

6. A semiconductor arrangement as recited in claim 3, wherein said protection diode is a pn junction diode.

7. A semiconductor arrangement as recited in claim 1, further comprising a channel stopper between said second diffusion region and said second buried layer.

8. A semiconductor structure, comprising:
   a substrate of a first conductivity type;
   a first doped region disposed in the substrate, the first doped region of a second conductivity type;
   an epitaxial layer disposed over the substrate and the first doped region, the epitaxial layer of the second conductivity type;

a first dielectric layer disposed over the epitaxial layer, the first dielectric layer having a plurality of opening therethrough;

a doped plug disposed in the epitaxial layer between a top surface of the epitaxial layer and a portion of the first doped region, the doped plug aligned with a first one of the plurality of openings in the first dielectric layer;

a first patterned doped polysilicon structure disposed over the first dielectric layer, and further disposed around an edge of a second one of the plurality of openings in the first dielectric layer, the first doped polysilicon structure of the first conductivity type;

a second dielectric layer disposed over the first dielectric lay r and the first pattern doped polysilicon structure, the second dielectric layer having a plurality of openings therethrough, a first one of the plurality of openings in the second dielectric layer being aligned with the first one of the openings in the first dielectric layer, and a second one of the plurality of openings in the second dielectric layer being aligned with the second one of the openings in the first dielectric layer;

a dielectric spacer disposed around an edge of the second one of the plurality of openings in the second dielectric layer;

a doped polysilicon plug disposed in through the second opening of the second dielectric layer, the doped polysilicon plug of the second conductivity type;

a second doped region of the second conductivity type disposed in the epitaxial layer at a surface portion of thereof and in contact with the doped polysilicon plug;

a third doped region of the first conductivity type disposed in the epitaxial layer subjacent the second doped region; and a fourth doped region of the second conductivity type, disposed in the epitaxial layer, aligned with, and spaced apart from, the third doped region, the fourth doped region further spaced apart from the first doped region.

9. The semiconductor structure of claim 8, further comprising:

a second patterned doped polysilicon structure disposed over the first dielectric layer, and further disposed in a third one of the plurality of openings in the first dielectric layer, and in contact with the epitaxial layer, the second doped polysilicon structure of the first conductivity type; and a fifth doped region of the first conductivity type, subjacent the second patt med doped polysilicon structure, the fifth doped region in contact with the second patterned doped polysilicon structure.

10. The semiconductor structure of claim 9, further comprising a channel stopper region having a first portion disposed in the epitaxial layer, and a second, portion disposed in the substrate, the channel stopper region of the first conductivity type, the first and second portions contiguous with each other.

11. The semiconductor structure of claim 9, wherein the third doped region comprises a first portion having a first thickness; and a second portion having a second thickness; wherein the first and second thicknesses are different.

12. The semiconductor structure of claim 9, wherein the first conductivity type is p-type and the second conductivity type is n-type.

13. The semiconductor structure of claim 9, wherein the dielectric spacer comprises silicon nitride.

14. The semiconductor structure of claim 9, wherein the fifth doped region has a third thickness, and the third thickness is greater than the first thickness and greater than the second thickness.

* * * * *